United States Patent
Yew et al.

(10) Patent No.: US 9,543,284 B2
(45) Date of Patent: Jan. 10, 2017

(54) 3D PACKAGES AND METHODS FOR FORMING THE SAME

(71) Applicant: Taiwan Semiconductor Manufacturing Company, Ltd., Hsin-Chu (TW)

(72) Inventors: Ming-Chih Yew, Hsin-Chu (TW); Fu-Jen Li, Hsin-Chu (TW); Kuo-Chuan Liu, Hsin-Chu (TW); Po-Yao Lin, Zhudong Township (TW); Wen-Yi Lin, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/970,250

(22) Filed: Dec. 15, 2015

(65) Prior Publication Data

US 2016/0111409 A1 Apr. 21, 2016

Related U.S. Application Data

(62) Division of application No. 13/961,589, filed on Aug. 7, 2013, now Pat. No. 9,252,076.

(51) Int. Cl.
*H01L 21/48* (2006.01)
*H01L 21/56* (2006.01)
(Continued)

(52) U.S. Cl.
CPC ............ *H01L 25/50* (2013.01); *H01L 21/486* (2013.01); *H01L 21/563* (2013.01); *H01L 21/565* (2013.01); *H01L 21/76802* (2013.01); *H01L 21/76877* (2013.01); *H01L 23/3121* (2013.01); *H01L 23/481* (2013.01);
(Continued)

(58) Field of Classification Search
CPC .... H01L 21/486; H01L 21/563; H01L 21/565; H01L 21/76802; H01L 21/76877; H01L 23/3121; H01L 23/481; H01L 23/49811; H01L 23/49816; H01L 23/49827; H01L 23/49838; H01L 23/562; H01L 25/0657; H01L 25/105
See application file for complete search history.

(56) References Cited

U.S. PATENT DOCUMENTS

| 6,222,272 B1 | 4/2001 | Takayama et al. |
| 6,392,143 B1 * | 5/2002 | Koshio ................. H01L 21/563 174/254 |

(Continued)

FOREIGN PATENT DOCUMENTS

| JP | 2009099669 | 5/2009 |
| JP | 2009105441 | 5/2009 |

(Continued)

*Primary Examiner* — Jarrett Stark
*Assistant Examiner* — Charles N Ausar-El
(74) *Attorney, Agent, or Firm* — Slater Matsil, LLP

(57) ABSTRACT

Embodiments of the present disclosure include a semiconductor device, a package and methods of forming a semiconductor device and a package. An embodiment is a semiconductor device including a molding material over a first substrate with a first opening having a first width in the molding material. The semiconductor device further includes a second opening having a second width in the molding material with the second width being greater than the first width. A first connector is in the first opening and a second connector is in the second opening.

20 Claims, 13 Drawing Sheets

(51) Int. Cl.
*H01L 21/768* (2006.01)
*H01L 23/00* (2006.01)
*H01L 23/498* (2006.01)
*H01L 25/10* (2006.01)
*H01L 25/065* (2006.01)
*H01L 25/00* (2006.01)
*H01L 23/48* (2006.01)
*H01L 23/31* (2006.01)

(52) U.S. Cl.
CPC .. *H01L 23/49811* (2013.01); *H01L 23/49816* (2013.01); *H01L 23/49827* (2013.01); *H01L 23/49838* (2013.01); *H01L 23/562* (2013.01); *H01L 25/0657* (2013.01); *H01L 25/105* (2013.01); *H01L 23/49822* (2013.01); *H01L 24/13* (2013.01); *H01L 24/16* (2013.01); *H01L 24/32* (2013.01); *H01L 24/48* (2013.01); *H01L 24/73* (2013.01); *H01L 24/81* (2013.01); *H01L 2224/0401* (2013.01); *H01L 2224/04042* (2013.01); *H01L 2224/131* (2013.01); *H01L 2224/13111* (2013.01); *H01L 2224/13147* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/81424* (2013.01); *H01L 2224/81439* (2013.01); *H01L 2224/81444* (2013.01); *H01L 2224/81447* (2013.01); *H01L 2224/81484* (2013.01); *H01L 2224/81815* (2013.01); *H01L 2224/81895* (2013.01); *H01L 2225/0651* (2013.01); *H01L 2225/06548* (2013.01); *H01L 2225/06568* (2013.01); *H01L 2225/1023* (2013.01); *H01L 2225/1058* (2013.01); *H01L 2924/12042* (2013.01); *H01L 2924/1431* (2013.01); *H01L 2924/1432* (2013.01); *H01L 2924/1434* (2013.01); *H01L 2924/157* (2013.01); *H01L 2924/15311* (2013.01); *H01L 2924/15331* (2013.01); *H01L 2924/181* (2013.01); *H01L 2924/1815* (2013.01); *H01L 2924/18161* (2013.01); *H01L 2924/3511* (2013.01); *H01L 2924/37001* (2013.01)

(56) References Cited

U.S. PATENT DOCUMENTS

| | | | |
|---|---|---|---|
| 8,288,208 B1* | 10/2012 | Liu | H01L 23/3677 438/118 |
| 8,920,934 B2* | 12/2014 | Jiang | H01L 23/49816 257/772 |
| 8,928,132 B2* | 1/2015 | Choi | H01L 23/3128 257/686 |
| 2004/0207052 A1 | 10/2004 | Joshi et al. | |
| 2007/0152350 A1* | 7/2007 | Kim | H01L 23/3128 257/786 |
| 2008/0157353 A1 | 7/2008 | Watanabe et al. | |
| 2009/0039490 A1* | 2/2009 | Fan | H01L 23/49838 257/686 |
| 2010/0072600 A1 | 3/2010 | Gerber | |
| 2010/0283140 A1 | 11/2010 | Kim et al. | |
| 2011/0037156 A1* | 2/2011 | Chandrasekaran | H01L 23/3128 257/686 |
| 2011/0068481 A1 | 3/2011 | Park et al. | |
| 2011/0193219 A1 | 8/2011 | Lai et al. | |
| 2011/0233771 A1* | 9/2011 | Kwon | H01L 23/49816 257/737 |
| 2011/0254160 A1 | 10/2011 | Tsai et al. | |
| 2011/0291275 A1 | 12/2011 | Lin et al. | |
| 2012/0021183 A1 | 1/2012 | Huang et al. | |
| 2012/0091597 A1 | 4/2012 | Kwon et al. | |
| 2012/0153499 A1 | 6/2012 | Byun et al. | |
| 2012/0217628 A1 | 8/2012 | Chou et al. | |
| 2012/0319284 A1* | 12/2012 | Ko | H01L 25/105 257/773 |
| 2013/0093079 A1 | 4/2013 | Tu et al. | |
| 2013/0099385 A1* | 4/2013 | Chen | H01L 23/3128 257/773 |
| 2013/0119549 A1 | 5/2013 | Cheng et al. | |
| 2013/0168856 A1* | 7/2013 | Wang | H01L 25/105 257/738 |
| 2013/0234317 A1 | 9/2013 | Chen et al. | |
| 2013/0307140 A1 | 11/2013 | Huang et al. | |
| 2013/0313726 A1 | 11/2013 | Uehling | |
| 2014/0264940 A1 | 9/2014 | Byun et al. | |
| 2014/0367867 A1 | 12/2014 | Lin et al. | |
| 2014/0374902 A1 | 12/2014 | Lee et al. | |
| 2015/0001708 A1 | 1/2015 | Lin | |

FOREIGN PATENT DOCUMENTS

| | | |
|---|---|---|
| KR | 20080061969 | 7/2008 |
| KR | 20120070093 | 6/2012 |
| KR | 20130042421 A | 4/2013 |
| KR | 20130045138 | 5/2013 |

* cited by examiner

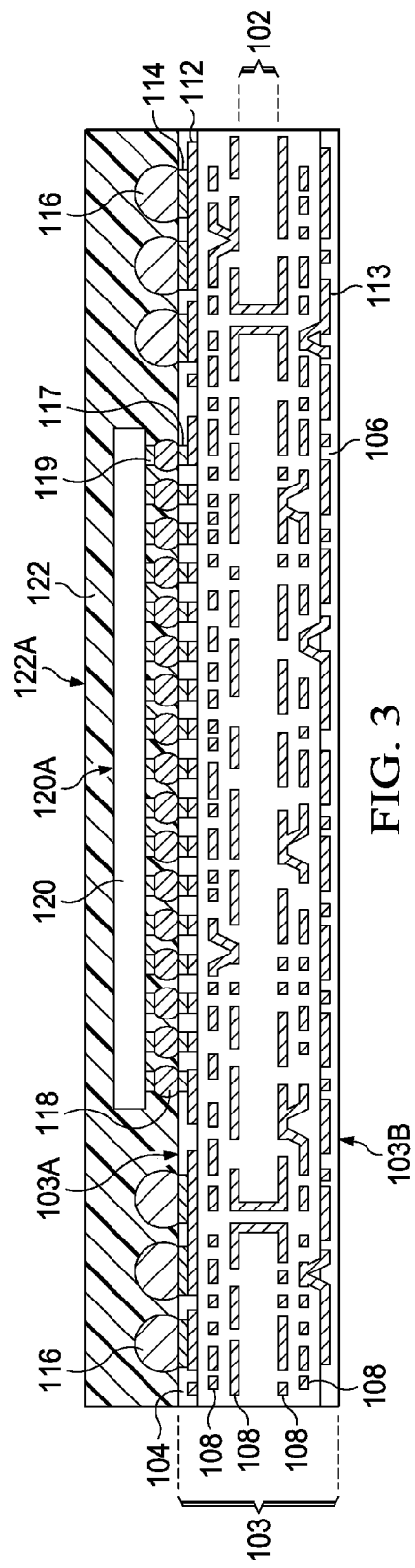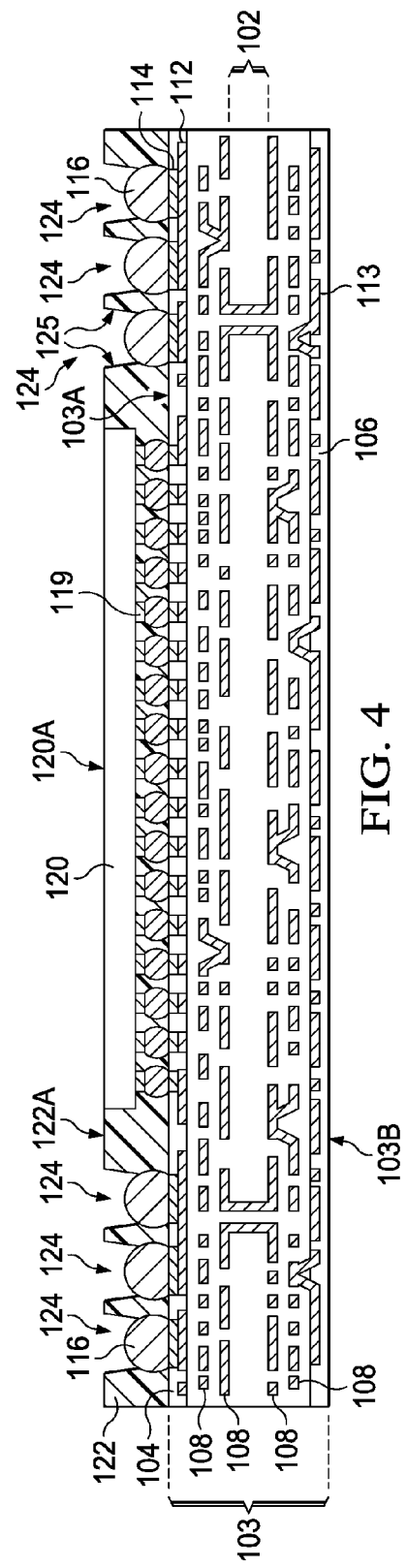

3D PACKAGES AND METHODS FOR FORMING THE SAME

PRIORITY CLAIM

This application claims the benefit to and is a divisional of U.S. patent application Ser. No. 13/961,589, filed on Aug. 7, 2013, and entitled "3D Packages and Methods for Forming the Same" which application is incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. In addition, when more devices are put into one chip or die, more complex designs are required.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1 through 6 illustrate intermediate stages of forming a semiconductor device according to an embodiment;

DETAILED DESCRIPTION OF ILLUSTRATIVE EMBODIMENTS

Figure 1:
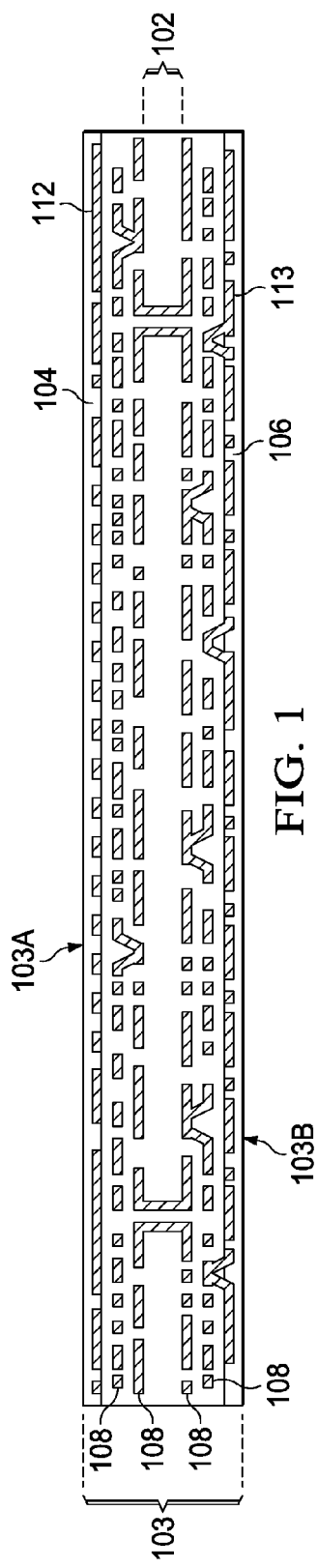

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a semiconductor device including more than one through molding via configuration. Other embodiments may also be applied, however, to other package structure configurations.

Figure 14:
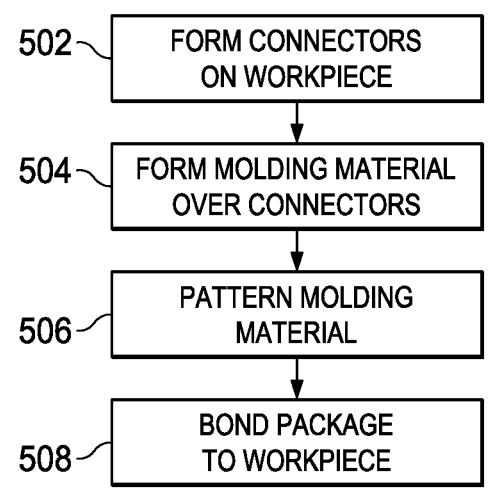
FIG. 14 illustrates a process flow of the process illustrated in FIGS. 1 through 6 according to an embodiment.

FIGS. 1 through 6 are cross-sectional views of intermediate stages in the manufacturing of a semiconductor device according to an embodiment, and FIG. 14 is a process flow of the process shown in FIGS. 1 through 6.

FIG. 1 illustrates the formation of a workpiece 103 including a substrate 102, metallization layers and vias 108 on two sides of the substrate 102, passivation layers 104 and 106, and redistribution lines (RDLs) 112 and 113. In some embodiments, the substrate 102 is made of a semiconductor material such as silicon, germanium, diamond, or the like. In other embodiments, the substrate 102 is made of compound materials such as silicon germanium, silicon carbide, gallium arsenic, indium arsenide, indium phosphide, silicon germanium carbide, gallium arsenic phosphide, gallium indium phosphide, the like, or a combination thereof. In an embodiment, the substrate 102 is a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof.

In some embodiments, the substrate 102 includes active and passive devices (not shown in FIG. 1). As one of ordinary skill in the art will recognize, a wide variety of devices such as transistors, capacitors, resistors, combinations of these, and the like may be used for the semiconductor device. The devices may be formed using any suitable methods.

There are metallization layers 108 on two sides the substrate 102. The metallization layers 108 are formed adjacent the active and passive devices and are designed to connect the various devices to form functional circuitry. The metallization layers 108 are formed of alternating layers of dielectric (e.g., low-k dielectric material) and conductive material (e.g., copper) with vias interconnecting the layers of conductive material and are formed through any suitable process (such as deposition, damascene, dual damascene, or the like).

The frontside and backside passivation layers 104 and 106, respectively, are formed over and under the substrate 102 as it is oriented in FIG. 1. The passivation layers 104 and 106 can be silicon nitride, silicon carbide, silicon oxide, low-k dielectrics such as carbon doped oxides, extremely low-k dielectrics such as porous carbon doped silicon dioxide, a polymer, such as an epoxy, polyimide, benzocyclobutene (BCB), polybenzoxazole (PBO), the like, or a combination thereof, although other relatively soft, often organic, dielectric materials can also be used. In some embodiments, the passivation layers 104 and 106 are deposited by chemical vapor deposition (CVD), physical vapor deposition (PVD), atomic layer deposition (ALD), a spin-on-dielectric process, the like, or a combination thereof.

Redistribution lines (RDLs) 112 and 113 are formed in the passivation layers 104 and 106, respectively, and are coupled to the metallization layers 108. In some embodiments, RDLs 112 and 113 are formed by depositing metal layers, patterning the metal layers, and forming the passivation layers 104 and 106 over the RDLs 112 and 113, respectively. In alternative embodiments, RDLs 112 and 113 are formed using damascene processes. In some embodiments, the RDLs 112 and 113 are made of a metal or metal alloy including aluminum, copper, tungsten, the like, or a combination thereof.

Figure 2:
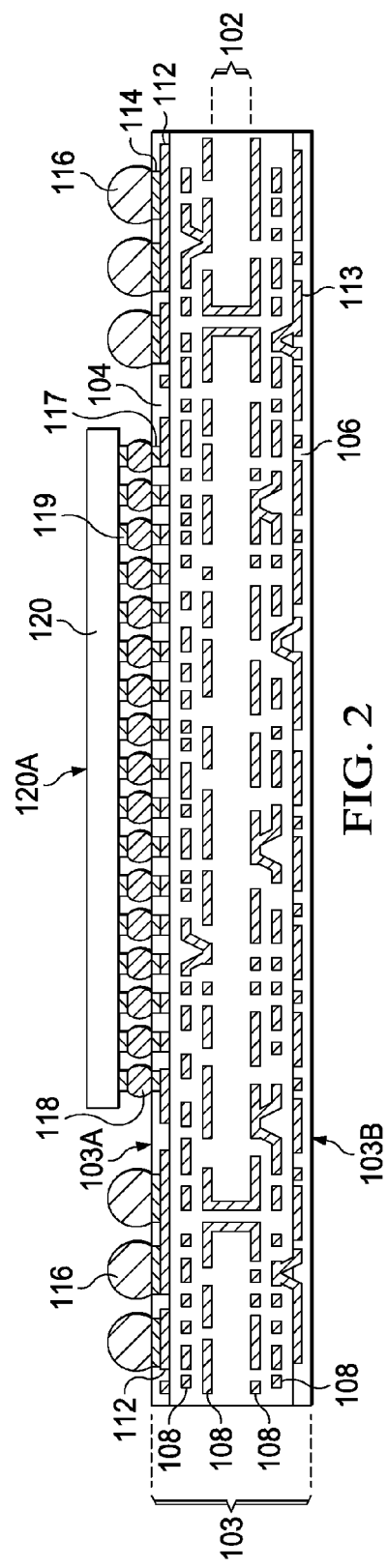

FIG. 2 illustrates the formation of connectors 116 on the workpiece 103 (step 502 in FIG. 14) and the bonding of a die 120 to the workpiece 103. The connectors 116 are formed on the bond pads 114 and the die 120 is bonded to the workpiece 103 via connectors 118 and bond pads 117. The bond pads 114 and 117 are formed in the passivation layer 104 or on the passivation layer 104. In some embodiments, the bond pads 114 and 117 are formed by forming recesses (not shown) into the passivation layer 104. The recesses are formed to allow the bond pads 114 and 117 to be embedded into the passivation layer 104. In other embodiments, the recesses are omitted and the bond pads 114 and 117 are formed on the passivation layer 104. The bond pads 114 electrically couple the subsequently bonded connectors 116 to the RDLs 112 and the bond pads 117 electrically couple the subsequently bonded die 120 to the RDLs 117 and/or the connectors 116. In some embodiments, the bond pads 114 and 117 include a thin seed layer (not shown) deposited over the workpiece 103, such as by PVD, CVD, ALD, the like, or a combination thereof. The seed layer is made of copper, titanium, nickel, gold, the like, or a combination thereof. In some embodiments, the conductive material of the bond pads 114 and 117 is deposited over the thin seed layer. In some embodiments, the conductive material is formed by an electro-chemical plating process, CVD, ALD, PVD, the like, or a combination thereof. In an embodiment, the conductive material of the bond pads 114 and 117 is copper, tungsten, aluminum, silver, gold, the like, or a combination thereof.

In an embodiment, the bond pads 114 and 117 are UBMs 114 and 117 and include three layers of conductive materials, such as a layer of titanium, a layer of copper, and a layer of nickel. However, many suitable arrangements of materials and layers for the formation of the UBMs 114 and 117 are within the contemplated scope of the present disclosure. For example, such arrangements include an arrangement of chrome/chrome-copper alloy/copper/gold, an arrangement of titanium/titanium tungsten/copper, an arrangement of copper/nickel/gold, or the like that are suitable. Further, any suitable materials or layers of material that may be used for the UBMs 114 and 117 are also within the contemplated scope of the current application.

After the bond pads 114 are formed, the connectors 116 are formed on the bond pads 114. The connectors 116 are subsequently formed into the through-molding vias (TMVs) 130 in FIG. 6 to allow the bottom package 100 in FIG. 6 to be coupled to a top package 200 in FIG. 6. The connectors 116 are illustrated as micro bumps in FIG. 2. However, in other embodiments, the connectors 116 are solder balls, metal pillars, controlled collapse chip connection (C4) bumps, electroless nickel-electroless palladium-immersion gold technique (ENEPIG) formed bumps, or the like. The connectors 116 include a conductive material such as solder, copper, aluminum, gold, nickel, silver, palladium, tin, the like, or a combination thereof. In an embodiment in which the connectors 116 are solder bumps, the connectors 116 are formed by initially forming a layer of solder on the bond pads 114 through various methods such as evaporation, electroplating, printing, solder transfer, ball placement, or the like. In this embodiment, once a layer of solder has been formed on the bond pads 114, a reflow is performed to shape the material into the desired bump shape. In another embodiment, the connectors 116 are metal pillars (such as a copper pillars) formed by a sputtering, printing, electro plating, electroless plating, CVD, or the like. In an embodiment, the metal pillars are solder free and have substantially vertical sidewalls. In some embodiments, a metal cap layer (not shown) is formed on the top of the metal pillar connectors 116. In some embodiments, the metal cap layer includes nickel, tin, tin-lead, gold, silver, palladium, indium, nickel-palladium-gold, nickel-gold, the like, or a combination thereof and is formed by a plating process.

After the bond pads 117 are formed, an active surface of the dies 120 that has the connectors 118 is bonded to the top surface 103A of the workpiece 103 by way of the connectors 118 and the bond pads 117. In an embodiment, the die 120 is a device die having integrated circuit devices, such as transistors, capacitors, inductors, resistors (not shown), and the like, therein. In another embodiment, the die 120 is a logic die having core circuits, and may be, for example, a central processing unit (CPU) die. In some embodiments, the die 120 includes multiple stacked dies like a memory stacking. The connectors 118 are bonded to contacts or bond pads 119 on the die 120. The connectors 118 may be similar to the connectors 116 described above and the description is not repeated herein, although connectors 116 and 118 are not necessarily the same.

In some embodiments, the bonding between the die 120 and the workpiece 103 is a solder bonding or a direct metal-to-metal bonding, such as a copper-to-copper or tin-to-tin bonding. In an embodiment, the die 120 is bonded to the workpiece 103 by a reflow process. During this reflow process, the connectors 118 are in contact with the bond pads 117 and the die 120 to physically and electrically couple the die 120 to the workpiece 103.

After the connectors 116 are formed and the die 120 is placed, molding material 122 is molded on and around the connectors 116 and the die 120 (step 504 in FIG. 14). The molding material 122 fills the gaps between the connectors 116 and the die 120, and may be in contact with passivation layer 104. In an embodiment, the molding material 122 is filled into the gaps between the die 120 and the passivation layer 104. In some embodiments, the molding material 122 is made of a molding compound, a molding underfill, an epoxy, a resin, the like, or a combination thereof. In some embodiments, the top surface 122A of the molding material 122 is higher than the top surface 120A of the die 120 and the top surfaces of the connectors 116.

FIG. 4 illustrates the patterning of the molding material 122 to expose the connectors 116 in openings 124 (step 506 in FIG. 14). In an embodiment, a thinning step, which may be a grinding step, is performed to thin the molding material 122, until the top surface 122A of the molding material 122 is substantially coplanar with the top surface 120A of the die 120. In some embodiments, the molding material 122 undergoes a pressure molding process by a pressure plate or mold (not shown) to shape the molding material 122 and push it into crevices surrounding the die 120 and connectors 116. The molding material is then patterned to form openings 124 in the molding material 122 to expose the connectors 116. Throughout this description, the openings 124 are alternatively referred to as TMV openings 124. In some embodiments, the TMV openings 124 are formed by a laser ablation or drilling process, an etching process, the like, or a combination thereof. The TMV openings 124 have sidewalls 125 which are non-perpendicular and non-parallel to a top surface 103A of the workpiece 103 with the sidewalls 125 diverging from each other when moving from the bottom surface of the molding material 122 to the top surface 122A of the molding material 122. In some embodiments, a workpiece 103 has TMV openings 124 with a plurality of opening sizes such that the volume of the various TMV openings 124 is different (see FIGS. 9A, 9B, 10A, and 10B).

Figure 5:
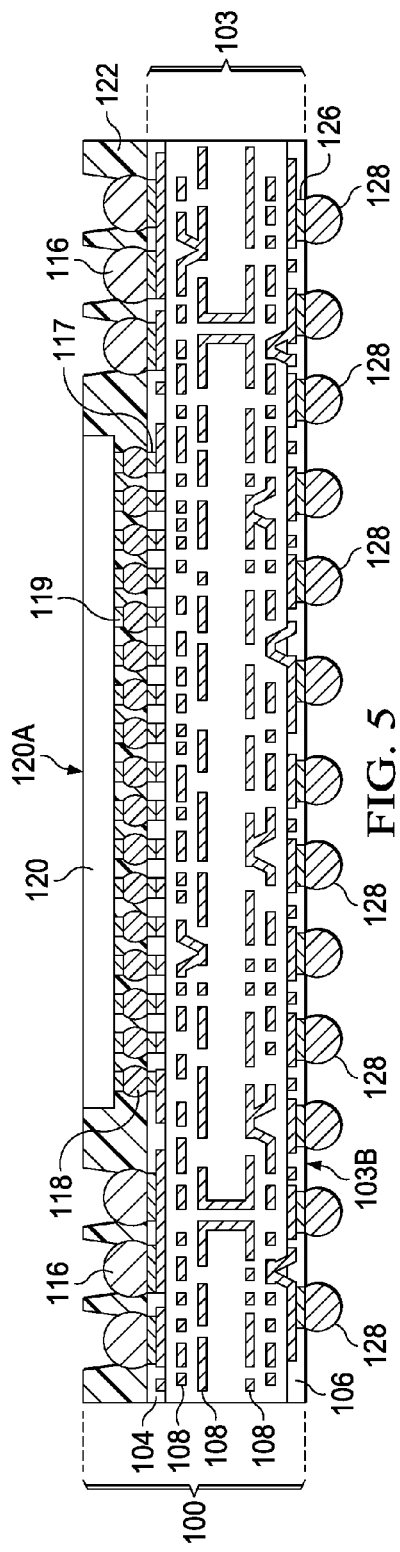

FIG. 5 illustrates the formation of bond pads 126 and connectors 128 on the bottom surface 103B of the workpiece 103 to allow external devices to be electrically and physically coupled to the bottom package 100. The bond pads 126 and the connectors 128 may be similar to the bond pads 117 and connectors 118 described above and the descriptions are not repeated herein, although the bond pads 117 and 126 or the connectors 118 and 128 are not necessarily the same.

Figure 6:
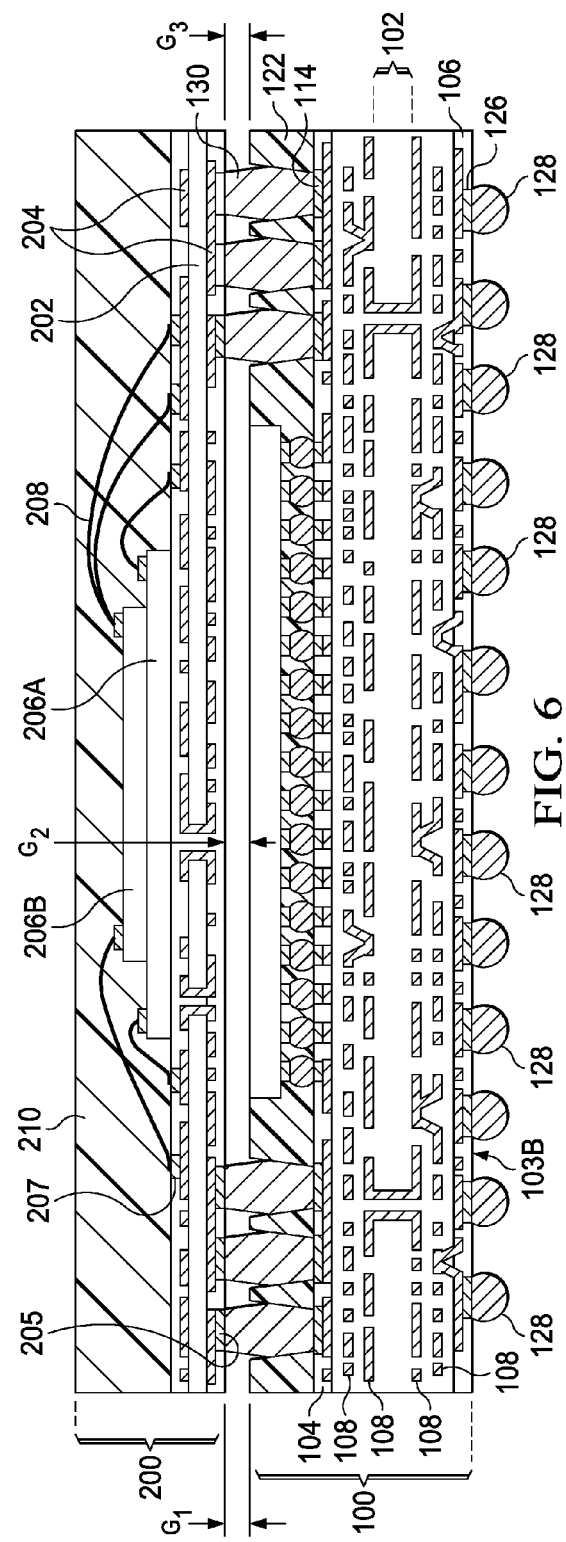

FIG. 6 illustrates the bonding of a top package 200 to the workpiece 103 (step 508 in FIG. 14) of the bottom package 100 to form TMVs 130. After the bonding, the bottom package 100 and the top package 200 has a gap between the two packages. In some embodiments, the gaps $G_1$, $G_2$, and $G_3$ between the packages are substantially equal from edge to edge. In some other embodiments, the gaps $G_1$, $G_2$, and $G_3$ vary from edge to edge caused by, for example, warpage of packages, such that a first edge region has a gap $G_1$, a middle region has a gap $G_2$, and a second edge region has a gap $G_3$ (see FIGS. 7A, 8A, 11A, 12A, and 13A). The gaps $G_1$ and $G_3$ are between the top surface 122A of the molding material 122 and the bottom surface of the substrate 202. In an embodiment, the gap $G_2$ is between the top surface 120A of the die 120 and the bottom surface of the substrate 202. In another embodiment, the gap $G_2$ is between the top surface 122A of the molding material 122 and the bottom surface of the substrate 202. In an embodiment, the gap $G_1$ is from about 0 μm to about 150 μm. In an embodiment, the gap $G_2$ is from about 0 μm to about 180 μm. In an embodiment, the gap $G_3$ is from about 0 μm to about 150 μm.

The top package 200 includes a substrate 202, metallization layers 204, bond pads 205 and 207, dies 206A and 206B, wire bonds 208, and molding compound 210. In some embodiments, the substrate 202 is made of a semiconductor material such as silicon, germanium, diamond, or the like. In other embodiments, the substrate 202 is made of compound materials such as silicon germanium, silicon carbide, gallium arsenic, indium arsenide, indium phosphide, silicon germanium carbide, gallium arsenic phosphide, gallium indium phosphide, the like, or a combination thereof. In an embodiment, the substrate 102 is a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. In some embodiments, the substrates 202 are based on an insulating core such as a fiberglass reinforced resin core. One example of the core material is fiberglass resin such as FR4. Alternatives for the core material include bismaleimide-triazine (BT) resin, or alternatively, other PC board materials or films. In some embodiments, build up films such as Ajinomoto build-up film (ABF) or other laminates are used for substrates 202.

In some embodiments, the substrate 202 includes active and passive devices (not shown in FIG. 6). A wide variety of devices such as transistors, capacitors, resistors, combinations of these, and the like may be used for the package 200. The devices may be formed using any suitable methods.

The top package 200 also includes metallization layers 204. The metallization layers 204 are formed adjacent the active and passive devices and are designed to connect the various devices to form functional circuitry. The metallization layers 204 are formed of alternating layers of dielectric (e.g., low-k dielectric material) and conductive material (e.g., copper) with vias interconnecting the layers of conductive material and are formed through any suitable process (such as deposition, damascene, dual damascene, or the like).

The bond pads 207 electrically couple the dies 206A and 206B via the wire bonds 208 to the metallization layers 204. The bond pads 205 electrically couple the TMVs 130 to the metallization layers 204 which allow the bottom package 100 to be electrically coupled to the top package 200. In some embodiments, the bond pads 205 and 207 include a thin seed layer (not shown) deposited over the substrate 202, such as by PVD, CVD, ALD, the like, or a combination thereof. The seed layer is made of copper, titanium, nickel, gold, the like, or a combination thereof. The conductive material of the bond pads 205 and 207 is deposited over the thin seed layer. In some embodiments, the conductive material is formed by an electro-chemical plating process, CVD, ALD, PVD, the like, or a combination thereof. In an embodiment, the conductive material of the bond pads 205 and 207 is copper, tungsten, aluminum, silver, gold, the like, or a combination thereof.

In an embodiment the bond pads 205 and 207 are UBMs 205 and 207 and include three layers of conductive materials, such as a layer of titanium, a layer of copper, and a layer of nickel. However, many suitable arrangements of materials and layers, such as an arrangement of chrome/chrome-copper alloy/copper/gold, an arrangement of titanium/titanium tungsten/copper, or an arrangement of copper/nickel/gold, are suitable for the formation of the UBMs 205 and 207. Any suitable materials or layers of material that may be used for the UBMs 205 and 207 are within the contemplated scope of the current application.

After the bond pads 207 are formed, the dies 206A and 206B are attached to the substrate 202 and coupled to the bond pads 207 by way of wire bonds 208. In some embodiments, the dies 206A and 206B are device dies having integrated circuit devices, such as transistors, capacitors, inductors, resistors (not shown), and the like, therein. In other embodiments, the dies 206A and 206B are logic dies having core circuits, and may be, for example, a CPU die. In some embodiments, the dies 206A and 206B include multiple stacked dies such as a memory stacking.

In an embodiment, a molding compound 210 is formed over the dies 206A and 206B, and wire bonds 208. The molding compound 210 protects the dies 206A and 206B and the wire bonds 208. In some embodiments, the molding compound 210 is made of a molding compound, a molding underfill, an epoxy, a resin, the like, or a combination thereof.

In some embodiments, the bonding between the top package 200 and the bottom package 100—by way of bond pads 205, TMVs 130, and bond pads 114—is a solder bonding or a direct metal-to-metal bonding, such as a copper-to-copper or tin-to-tin bonding. In an embodiment, the TMVs 130 are bonded to the bond pads 114 and 205 by a reflow process. During this reflow process, the TMVs 130 are in contact with the bond pads 114 and 205 to physically and electrically couple the top package 200 and the bottom package 100.

In an embodiment, an underfill material (not shown) is injected or otherwise formed in the gap between the bottom package 100 and the top package 200. In some embodiments, the underfill material is a liquid epoxy, deformable gel, silicon rubber, or the like, that is dispensed between the bottom package 100 and the top package 200, and then cured to harden. This underfill material is used, among other things, to reduce cracking in and to protect the TMVs 130.

Figure 7A:
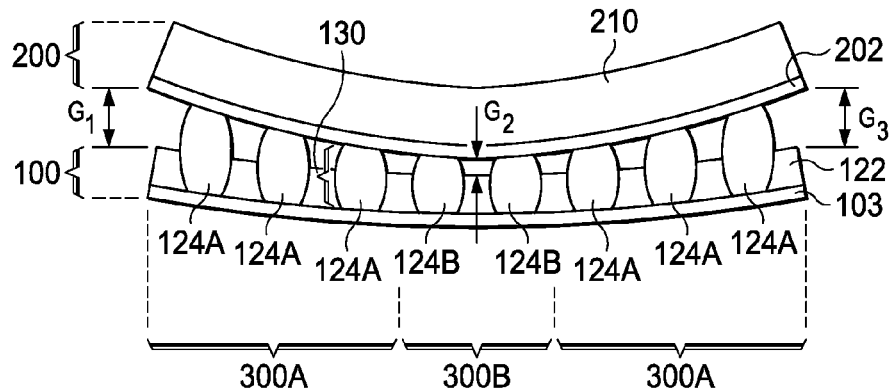
FIGS. 7A and 7B illustrate cross-sectional and top views of a semiconductor device according to an embodiment.
Figure 7B:
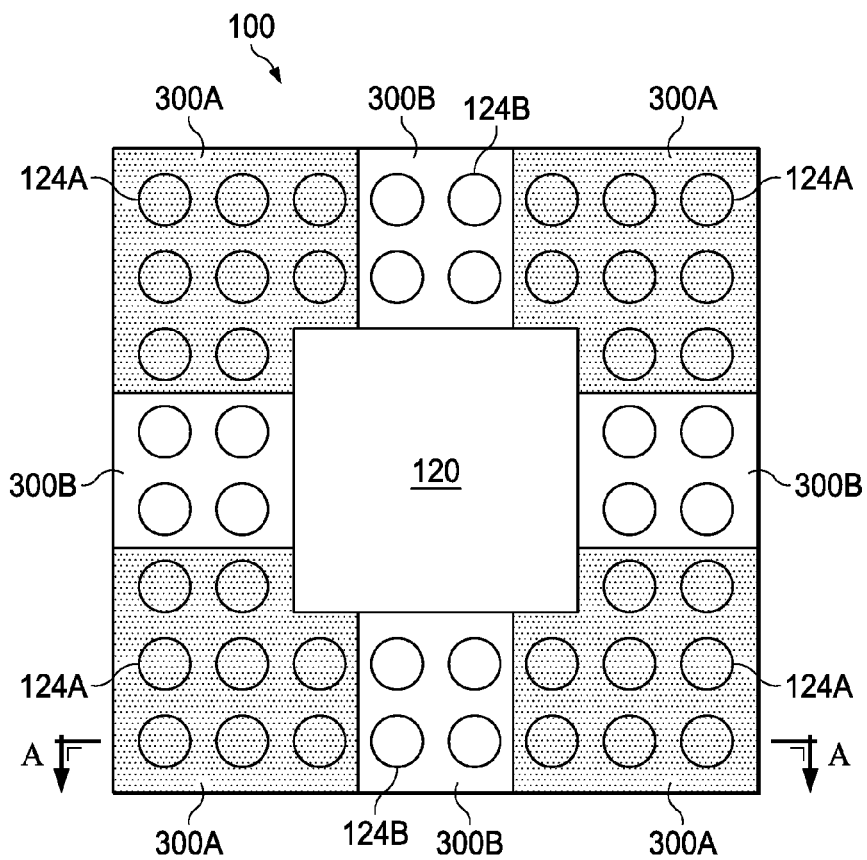

FIG. 7A illustrates a cross-sectional view taken along line A-A of FIG. 7B of a semiconductor device including the bottom package 100 bonded to the top package 200 by a plurality of TMVs 130. FIG. 7B illustrates a top view of FIG. 7A with the top package 200 removed so that the bottom package 100 may be viewed more clearly. In this embodiment, the gap $G_2$ in the middle region is smaller than the gaps $G_1$ and $G_3$ at the edge regions of the packages 100 and 200 as illustrated in the cross-sectional view of FIG. 7A.

FIG. 7B illustrates a top view of an embodiment with two sizes 124A and 124B of TMV openings 124. FIG. 7B illustrates a semiconductor device with a plurality of regions 300A having TMV openings 124A and with a plurality of regions 300B with TMV openings 124B. In this embodiment, the regions 300A are at the corners of the bottom package 100, with each of the regions 300B being between a pair of the regions 300A and adjacent the die 120.

Figure 7C:
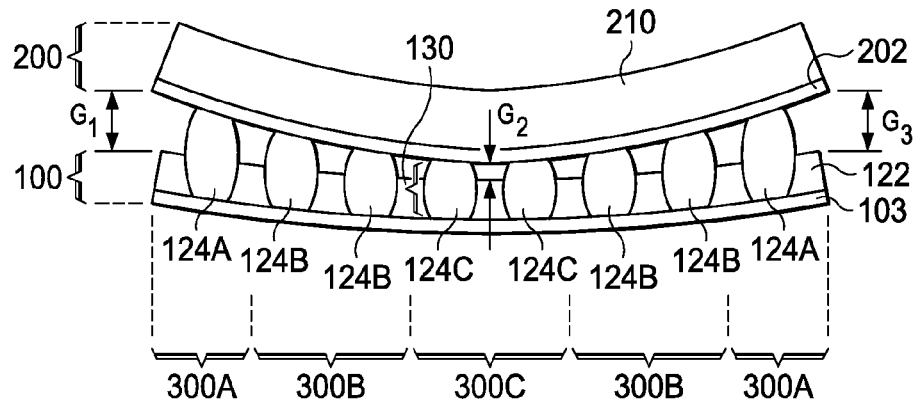
FIGS. 7C and 7D illustrate cross-sectional and top views of a semiconductor device according to an embodiment.
Figure 7D:
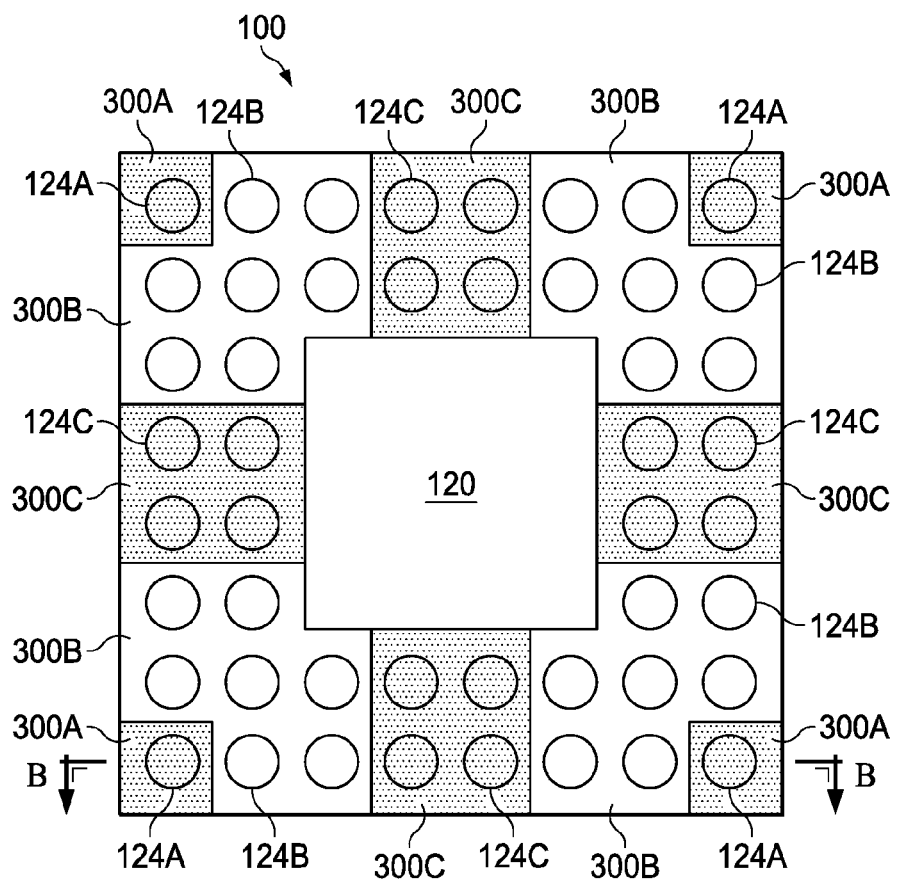

FIG. 7C illustrates a cross-sectional view taken along line B-B of FIG. 7D of a semiconductor device including the bottom package 100 bonded to the top package 200 by a plurality of TMVs 130. FIG. 7D illustrates a top view of FIG. 7C with the top package 200 removed so that the bottom package 100 may be viewed more clearly. In this embodiment, the gap $G_2$ in the middle region is smaller than the gaps $G_1$ and $G_3$ at the edge regions of the packages 100 and 200 as illustrated in the cross-sectional view of FIG. 7C.

FIG. 7D illustrates a top view of an embodiment with three sizes 124A, 124B, and 124C of TMV openings 124 with TMV opening 124C being larger than TMV opening 124B and TMV opening 124A being less than opening 124B. This embodiment has a plurality of regions 300A in the corners of the bottom package 100, a plurality of regions 300C having TMV openings 124C in the centers of each edge of the bottom package 100, and a plurality of regions 300B between regions 300A and 300C. By having three sizes 124A, 124B, and 124C of TMV openings 124, this embodiment is able to handle larger differences between the gap $G_2$ and gaps $G_1$ and $G_3$.

Figure 8A:
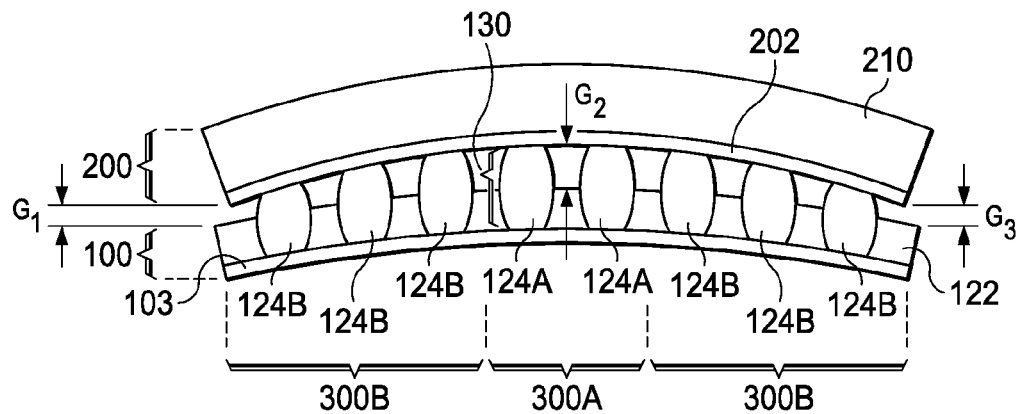
FIGS. 8A and 8B illustrate cross-sectional and top views of a semiconductor device according to an embodiment.
Figure 8B:
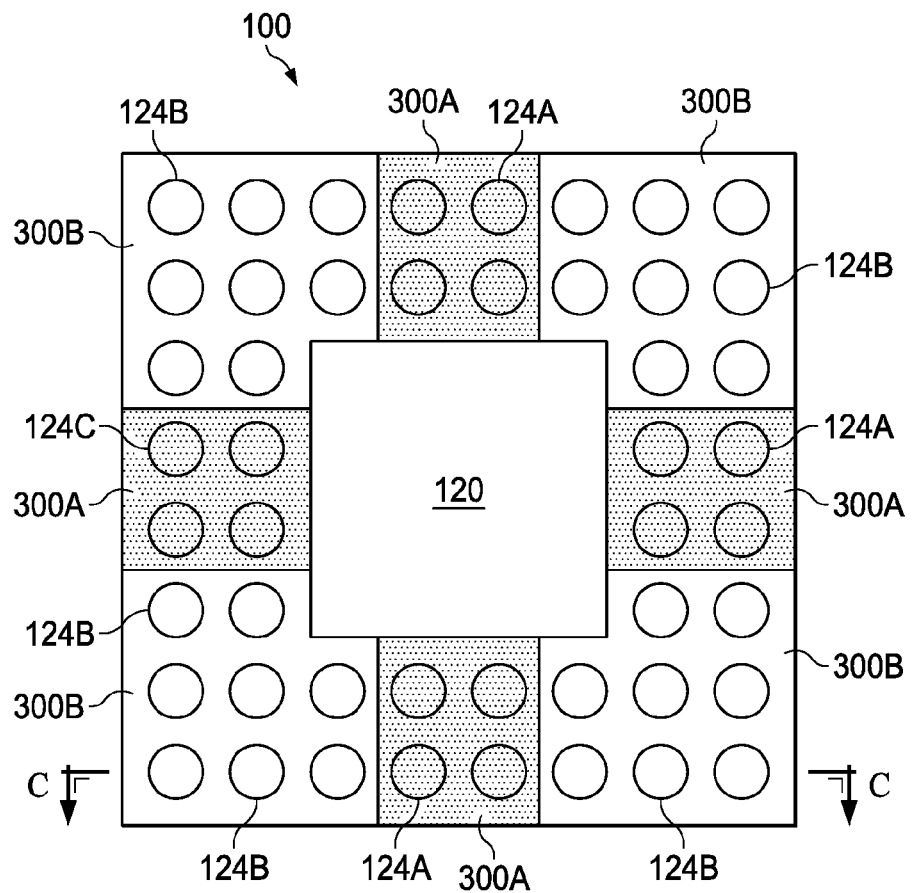

FIG. 8A illustrates a cross-sectional view taken along line C-C of FIG. 8B of a semiconductor device including the bottom package 100 bonded to the top package 200 by a plurality of TMVs 130 wherein the gap $G_2$ is larger than the gaps $G_1$ and $G_3$. In this embodiment, the bottom package 100 has a plurality of regions 300A having TMV openings 124A and a plurality of regions 300B with TMV openings 124B. In this embodiment, the regions 300B are at the corners of the bottom package 100, with each of the regions 300A between a pair of the regions 300B and adjacent the die 120.

Figure 9A:
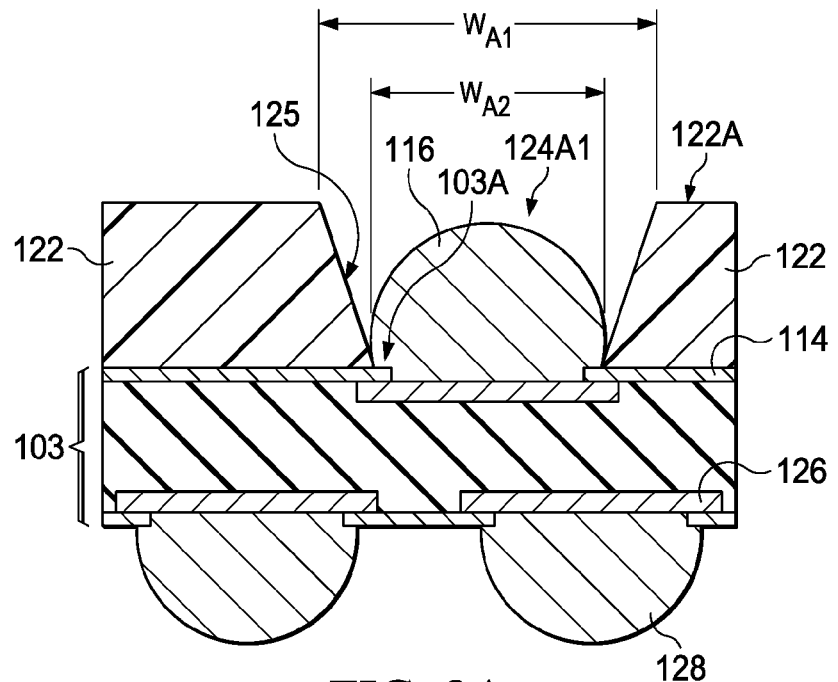
FIGS. 9A and 9B illustrate cross-sectional views of a through molding via according to an embodiment.
Figure 9B:
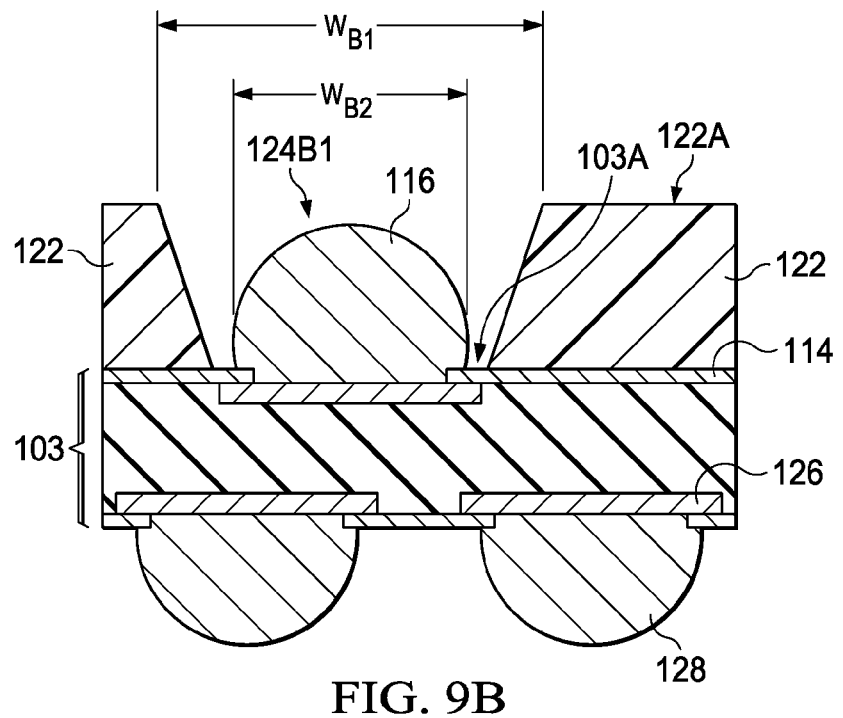

FIGS. 9A and 9B illustrate TMV openings 124A1 and 124B1, respectively, of different sizes. In these embodiments, the TMV openings 124A1 and 124B1 extend through the molding material 122 to the top surface 103A of the workpiece 103. The TMV opening 124A1 has a width $W_{A1}$ at the top surface 122A of the molding material 122 and a width $W_{A2}$ at the bottom surface of the molding material 122 with $W_{A2}$ being less than $W_{A1}$. The TMV opening 124B 1 has a width $W_{B1}$ at the top surface 122A of the molding material 122 and a width $W_{B2}$ at the bottom surface of the molding material 122 with $W_{B2}$ being less than $W_{B1}$ and greater than $W_{A2}$. Hence, the TMV opening 124B1 has a larger volume than the TMV opening 124A1. In an embodiment, the widths $W_{A1}$, $W_{A2}$, $W_{B1}$, and $W_{B2}$ are from 30 μm to about 1000 μm. The various widths of the TMV openings 124A1 and 124B 1 are controlled by, for example, the laser ablation process that patterns the molding material 122.

Figure 10A:
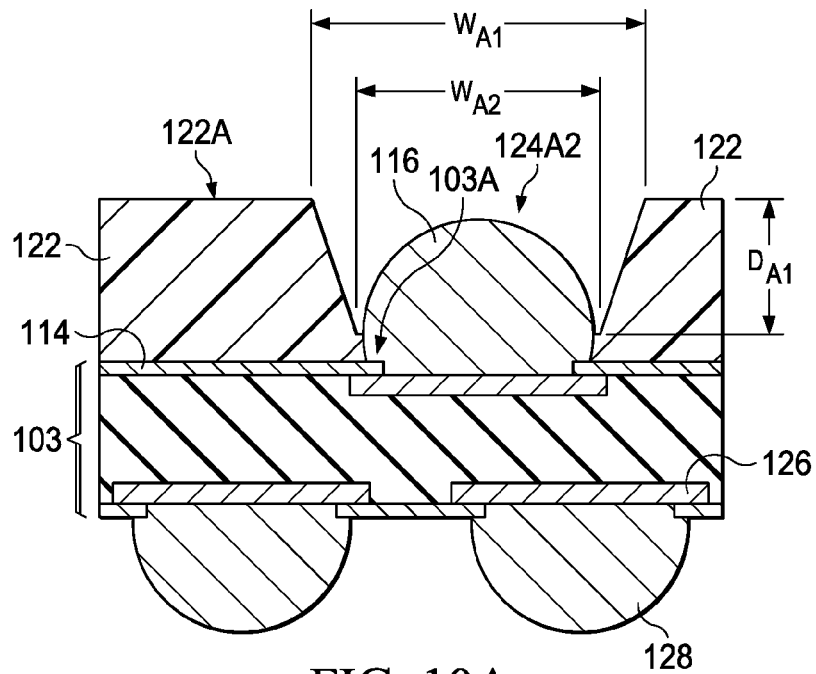
FIGS. 10A and 10B illustrate cross-sectional views of a through molding via according to an embodiment.
Figure 10B:
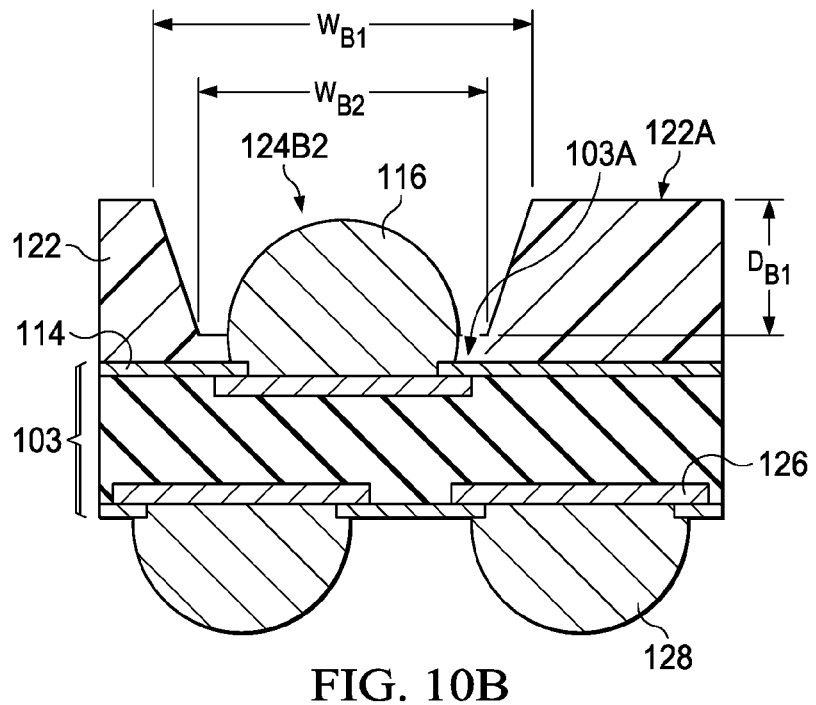

FIGS. 10A and 10B illustrate TMV openings 124A2 and 124B2 which are similar to TMV openings 124A1 and 124B1, respectively, except that some molding material 122 is left on the top surface 103A of the workpiece 103 in the TMV openings 124A2 and 124B2. The TMV opening 124A2 has a depth $D_{A1}$ which is less than the thickness of the molding material 122; hence the opening 124A2 does not extend all the way through the molding material 122. The TMV opening 124B2 has a depth $D_{B1}$ which is less than the thickness of the molding material 122; hence the opening 124B2 does not extend all the way through the molding material 122.

In some embodiments, a single semiconductor device includes TMV openings 124 of more than one size such that a semiconductor device includes some TMV openings 124A (124A1 and/or 124A2) and some TMV openings 124B (124B1 and/or 124B2). In some embodiments, the difference between the widths $W_{B2}$ and $W_{A2}$ is greater than 20 μm.

Figure 11A:
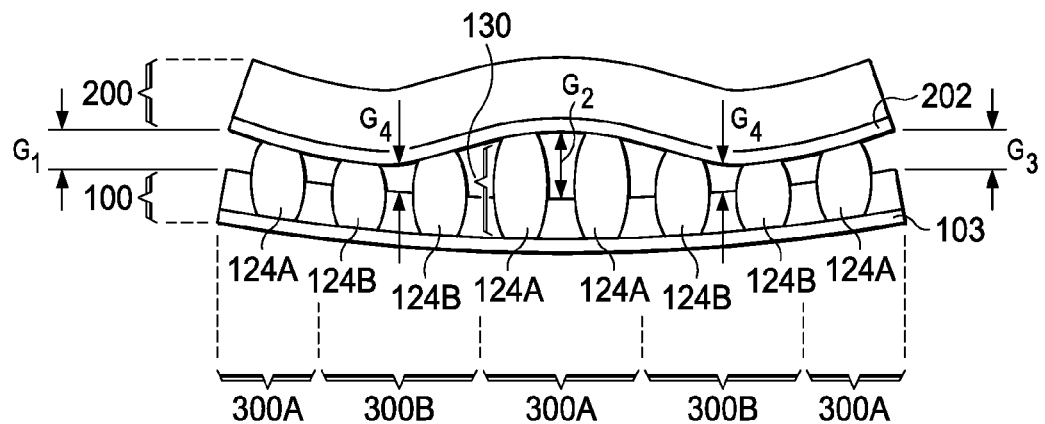
FIGS. 11A and 11B illustrate cross-sectional and top views of a semiconductor device according to an embodiment.
Figure 11B:
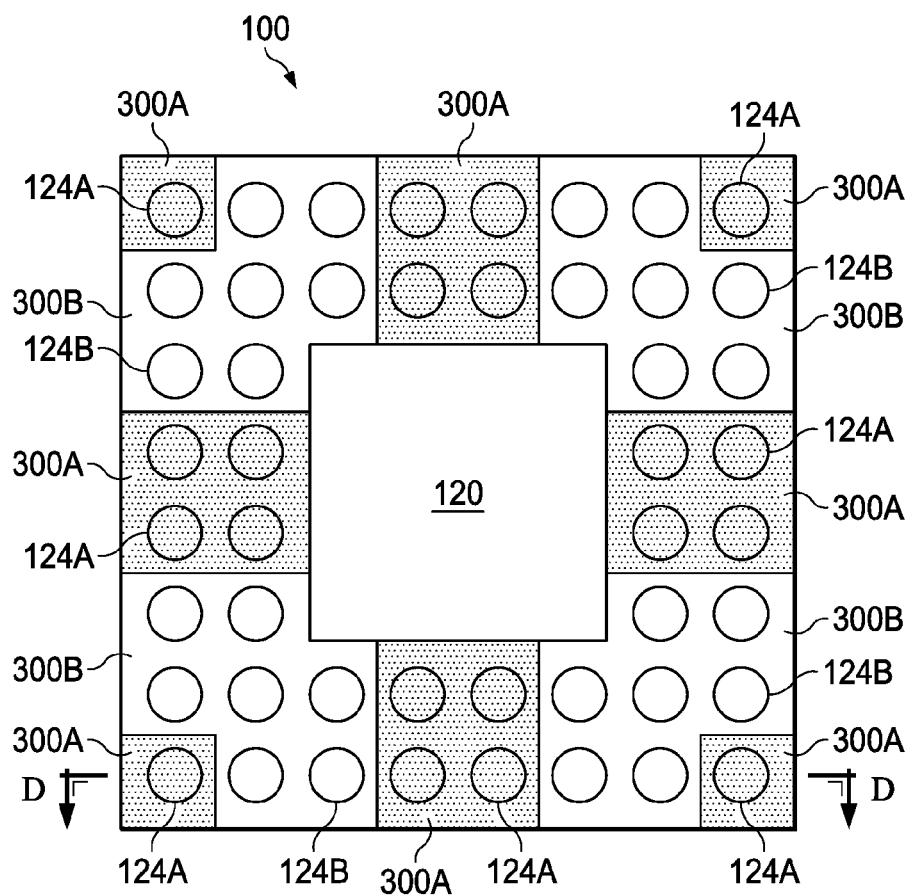

FIG. 11A illustrates a cross-sectional view taken along line D-D of FIG. 11B of a semiconductor device including the bottom package 100 bonded to the top package 200 by a plurality of TMVs 130 wherein the gap $G_2$ is larger than the gaps $G_1$ and $G_3$ and also including a gap $G_4$ on either side of the gap $G_2$ with the gap $G_4$ being smaller than gaps $G_1$ and $G_3$. In this embodiment, the bottom package 100 has a plurality of regions 300A having TMV openings 124A and with a plurality of regions 300B with TMV openings 124B. In this embodiment, a first set of the regions 300A are at the corners of the bottom package 100, a second set of the regions 300A are in the centers of each edge of the bottom package 100, and each of the regions 300B being between a pair of regions 300A.

Figure 12A:
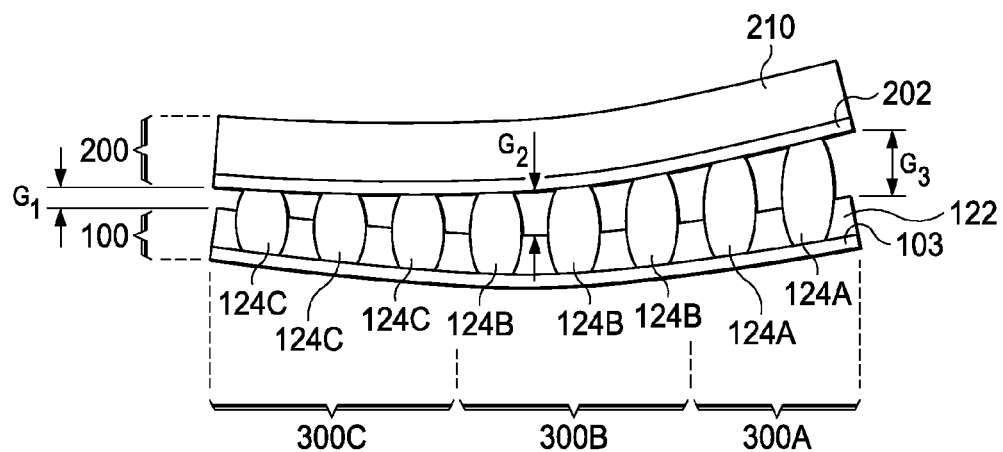
FIGS. 12A and 12B illustrate cross-sectional and top views of a semiconductor device according to an embodiment.
Figure 12B:
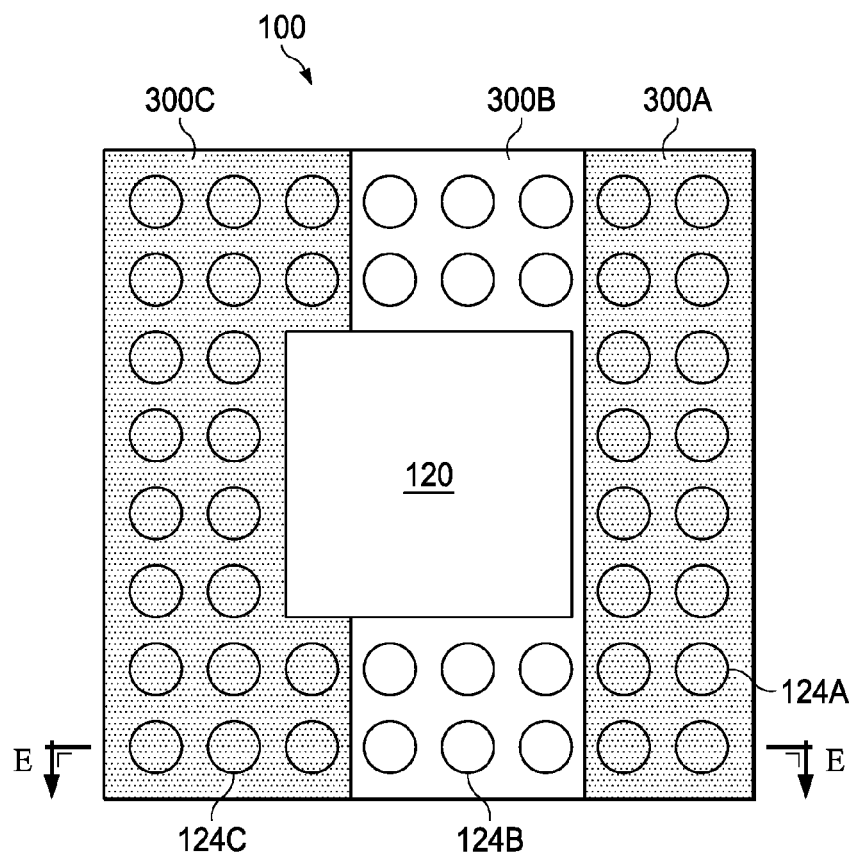

FIG. 12A illustrates a cross-sectional view taken along line E-E of FIG. 12B of a semiconductor device including the bottom package 100 bonded to the top package 200 by a plurality of TMVs 130 wherein the gap $G_3$ is larger than the gap $G_2$ which is larger than the gap $G_1$. In this embodiment, the bottom package 100 has a region 300A having TMV openings 124A, a region 300C with TMV openings 124C, and a region 300B with TMV openings 124B, the region 300B being between the regions 300A and 300C. In this embodiment, the regions 300A, 300B, and 300C are rectangular with region 300C aligned along an edge of the bottom package 100 and region 300A aligned along an opposite edge of the bottom package 100 with region 300B between regions 300C and 300A.

Figure 12C:
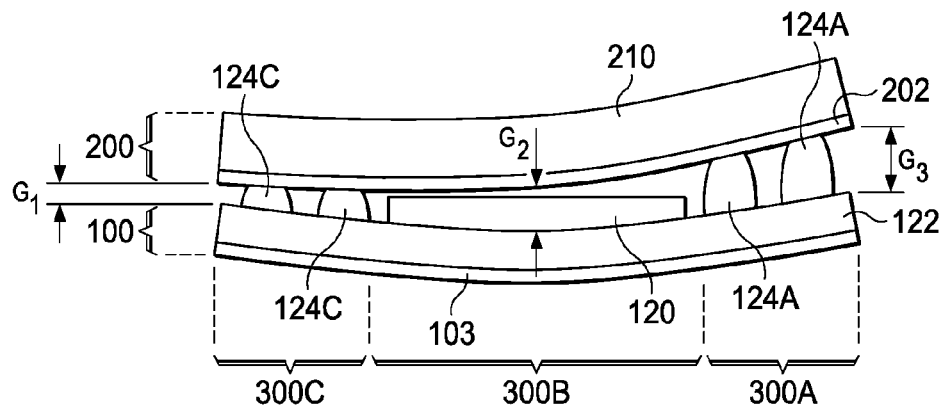
FIGS. 12C and 12D illustrate cross-sectional and top views of a semiconductor device according to an embodiment.
Figure 12D:
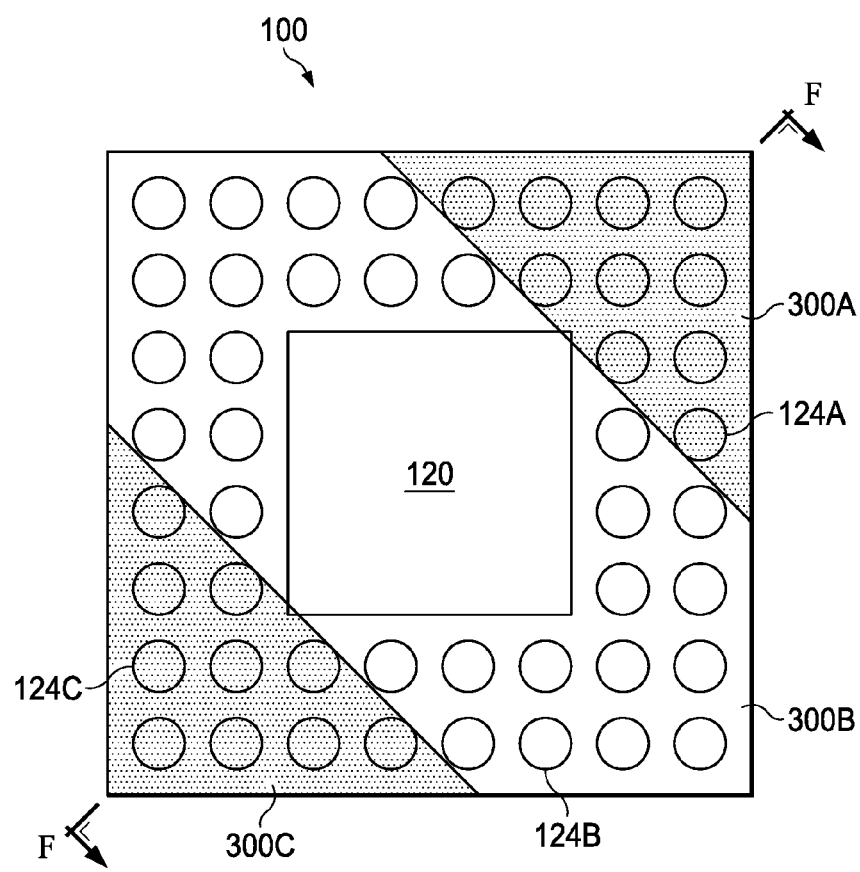

FIG. 12C illustrates a cross-sectional view taken along line F-F of FIG. 12D of a semiconductor device including the bottom package 100 bonded to the top package 200 by a plurality of TMVs 130 wherein the gap $G_3$ is larger than the gap $G_2$ which is larger than the gap $G_1$. In this embodiment, the bottom package 100 has a region 300A having TMV openings 124A, a region 300C with TMV openings 124C, and a region 300B with TMV openings 124B, the region 300B being between the regions 300A and 300C. In this embodiment, the regions 300A and 300C are triangular with a corner of the triangle being aligned with a corner of the bottom package 100, and region 300B is between the regions 300A and 300C.

Figure 13A:
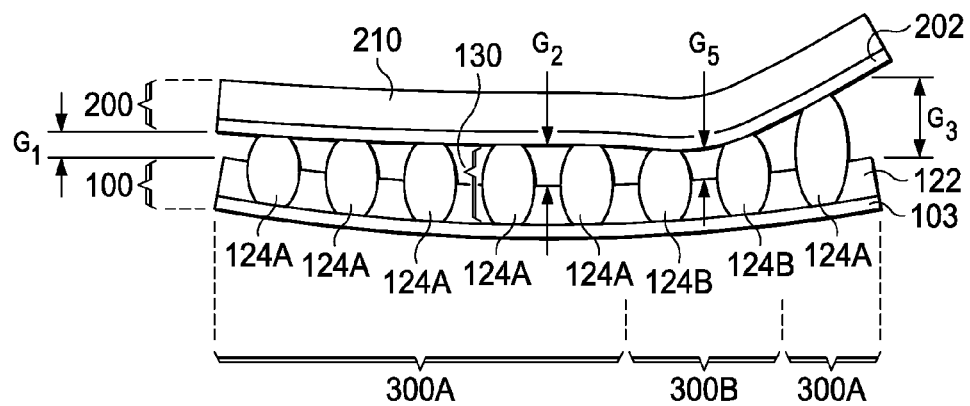
FIGS. 13A and 13B illustrate cross-sectional and top views of a semiconductor device according to an embodiment.
Figure 13B:
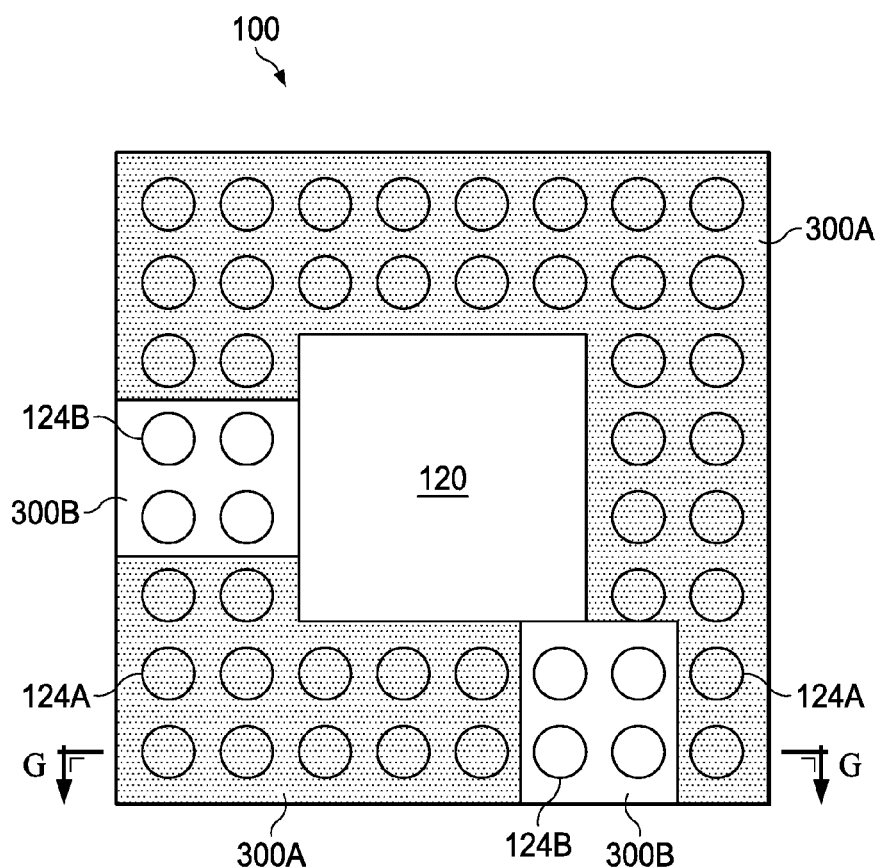

FIG. 13A illustrates a cross-sectional view taken along line G-G of FIG. 13B of a semiconductor device including the bottom package 100 bonded to the top package 200 by a plurality of TMVs 130 wherein the gap $G_2$ is larger than the gap $G_1$ and the gap $G_3$ is larger than the gap $G_2$ with a gap $G_5$ laterally between gaps $G_2$ and $G_3$ and gap $G_5$ being smaller than gap $G_1$. In this embodiment, the bottom package 100 has at least one region 300B having TMV openings 124B and at least one region 300A with TMV openings 124A. Further, the at least one region 300B is aligned with the gap $G_5$ and the at least one regions 300A is covering the remaining area of the bottom package 100.

The warpage of the top and bottom packages 200 and 100, respectively, varies greatly between designs and thus affects the process yield. The warpage of the packages can be measured during prototyping such that the TMV opening sizes 124A, 124B, and 124C in the various regions 300A, 300B, and 300C are configured to improve the process yield. By having the larger TMV openings 124 (e.g., TMV openings 124B and/or 124C) in the regions (e.g., 300B and 300C) where the gaps are smaller (see e.g., FIGS. 7A-7D and 8A-8B), the process yield is increased because the possibility of a bridge between adjacent TMVs is reduced. Also, by having smaller TMV openings (e.g., TMV openings 124A) in the regions (e.g., regions 300A) where the gaps are larger (see e.g., FIGS. 7A-7D and 8A-8B), the process yield is increased because the possibility of a cold joint for a TMV 130 is reduced.

An embodiment is a semiconductor device including a molding material over a first substrate with a first opening having a first width in the molding material. The semiconductor device further includes a second opening having a second width in the molding material with the second width being greater than the first width. A first connector is in the first opening and a second connector is in the second opening.

Another embodiment is a package including a bottom package and a top package including at least one active device. The bottom package includes a first die over a first substrate and a molding material over the first substrate surrounding the first die. The bottom package further includes a plurality of openings in the molding material with at least one of the plurality of openings having a first width at a first surface of the at least one opening, and at least one other of the plurality of openings having a second width at a first surface of the at least one other opening, the second width being greater than the first width. The bottom package further includes a plurality of through-molding vias (TMVs) over the first substrate, each of the plurality of TMVs being in one of the plurality of openings. The top package being couple to the plurality of TMVs.

A further embodiment is a method of forming a semiconductor device including forming a molding material over a first substrate and forming a first opening in the molding material with the first opening having a first width. The method further includes forming a second opening in the molding material with the second opening having a second width. The second width is larger than the first width. The method further includes forming a first through-molding via (TMV) in the first opening and a second TMV in the second opening.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and operations described in the specification. As one of ordinary skill in the art will readily appreciate from the disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A method of forming a semiconductor device, the method comprising:
    molding a molding material over a first substrate, the first substrate comprising a first edge region, a middle region next to the first edge region, and a second edge region next to the middle region and opposite the first edge region;
    forming a first opening in the molding material in the first edge region, the first opening having a first width;
    forming a first connector in the first opening;
    forming a second opening in the molding material in the middle region, the second opening having a second width, the second width being greater than the first width;
    forming a second connector in the second opening;
    forming a third opening in the in the molding material in the second edge region, the third opening having a third width, the third width being greater than the second width;
    forming a third connector in the third opening; and
    bonding a second package to the first connector, the second connector, and the third connector, a first surface of the second package being physically separated from a first surface of the molding material by a first gap in the first edge region, a second gap in the middle region, and a third gap in the second edge region, the first gap being greater than the second gap, and the second gap being greater than the third gap.

2. The method of claim 1, wherein the forming the first opening in the molding material comprises a laser ablation process.

3. The method of claim 1, wherein at least one of the first and second connectors are through-molding vias (TMVs).

4. The method of claim 1, wherein sidewalls of at least one of the first, second, and third openings are non-perpendicular and non-parallel to a first surface of the first substrate.

5. The method of claim 1, further comprising forming a die over the first substrate, a first surface of the molding material being coplanar with a first surface of the die.

6. The method of claim 1, wherein the first substrate comprises a first plurality of metallization layers and vias on a first side of the first substrate and a second plurality of metallization layers and vias on a second side of the first substrate, the first side being opposite the second side.

7. The method of claim 1, wherein forming the first opening, forming the second opening, and forming the third opening comprises drilling the first opening, the second opening, and the third opening to a depth that is less than a thickness of the molding material.

8. The method of claim 1, wherein in a top down view, the first edge region, the middle region, and the second edge region are rectangular, and wherein the second edge region is wider than the middle region, and the middle region is wider than the first edge region.

9. A method of forming a semiconductor device, the method comprising:
  forming a first plurality of metallization layers and vias on a first side of a substrate;
  forming a second plurality of metallization layers and vias on a second side of the substrate, the second side being opposite the first side;
  bonding a die on the first side of the substrate;
  forming a first plurality of connectors on the first side of the substrate;
  molding a molding material on the first side of the substrate, a top surface of the molding material being coplanar with a top surface of the die, and the molding material having a first region, a second region, and a third region;
  forming a plurality of first openings in the molding material in the first region and the third region, the plurality of first openings having a first width at the top surface of the molding material;
  forming a plurality of second openings in the molding material in the second region, the plurality of second openings having a second width at the top surface of the molding material, the second width being greater than the first width; and
  forming a plurality of through-molding vias (TMVs) over the substrate, each of the plurality of TMVs being in one of the first plurality of openings or the second plurality of openings.

10. The method of claim 9, further comprising coupling a top package to the plurality of TMVs.

11. The method of claim 10, wherein coupling the top package to the plurality of TMVs further comprises:
  creating a first gap between the top surface of the molding material and a first surface of the top package in the first region; and
  creating a second gap between the top surface of the molding material and the first surface of the top package in the second region, the first gap being larger than the second gap.

12. The method of claim 11, wherein coupling the top package to the plurality of TMVs further comprises creating a third gap between the top surface of the molding material and the first surface of the top package in the third region, the third gap being larger than the second gap and smaller than the first gap.

13. The method of claim 9, wherein the third region is in each corner of the substrate, the first region is in the center of each edge of the substrate, and the second region is laterally between each of the first and third regions along each edge of the substrate.

14. The method of claim 9, wherein molding the molding material comprises:
  pressure molding the molding material to shape the molding material and press it into crevices surrounding the die and the first plurality of connectors; and
  thinning the molding material until the top surface of the molding material is coplanar with the top surface of the die.

15. The method of claim 9, wherein bonding the die on the first side of the substrate further comprises bonding the die to a second plurality of connectors formed on the first side of the substrate.

16. The method of claim 9, further comprising forming a second plurality of connectors on the second side of the substrate, the second plurality of connectors being configured to couple external devices to the substrate.

17. A method of forming a package, the method comprising:
  forming a bottom package having a first region, a second region, and a third region, the first and third regions being triangular from a top down view, a corner of each triangle being aligned with a respective diagonally opposite corner of the bottom package, wherein forming the bottom package further comprises:
    forming a molding material over a first substrate;
    forming a first plurality of openings in the molding material in the first region, the first plurality of openings having a first width at a first surface of the molding material;
    forming a second plurality of openings in the molding material in the second region, the second plurality of openings having a second width at the first surface of the molding material, the second width being greater than the first width;
    forming a third plurality of openings in the molding material in the third region, the third plurality of openings having a third width at the first surface of the molding material, the third width being greater than the second width; and
    forming a plurality of through-molding vias (TMVs) over the first substrate, each of the plurality of TMVs being in one of the first, second, and third plurality of openings; and
  coupling a top package to the plurality of TMVs, the top package comprising at least one active device, the first region having a first gap between the first surface of the molding material and a first surface of the top package, the second region having a second gap between the first surface of the molding material and the first surface of the top package, the second gap being smaller than the first gap, and the third region having a third gap between the first surface of the molding material and the first surface of the top package, the third gap being smaller than the second gap.

18. The method of claim 17, wherein sidewalls of the first and second plurality of openings are non-perpendicular and non-parallel to a major surface of the first substrate.

19. The method of claim 17, further comprising placing a die over the first substrate in the bottom package, the first surface of the molding material being coplanar with a first surface of the die.

20. The method of claim 17, wherein forming the first plurality of openings, forming the second plurality of openings, and forming the third plurality of openings comprises etching the first plurality of openings, the second plurality of openings, and the third plurality of openings to a depth less than a thickness of the molding material.

* * * * *